US012677692B2

(12) United States Patent
Dong et al.

(10) Patent No.: US 12,677,692 B2
(45) Date of Patent: Jul. 7, 2026

(54) INSULATION LAYER FOR A SEMICONDUCTOR PACKAGE

(71) Applicant: Sandisk Technologies, Inc., Milpitas, CA (US)

(72) Inventors: Shaopeng Dong, Shanghai (CN); Fen Yu, Shanghai (CN); Weng Khoon Mong, Penang (MY)

(73) Assignee: Sandisk Technologies, Inc., Milpitas, CA (US)

( * ) Notice: Subject to any disclaimer, the term of this patent is extended or adjusted under 35 U.S.C. 154(b) by 353 days.

(21) Appl. No.: 18/362,128

(22) Filed: Jul. 31, 2023

(65) Prior Publication Data

US 2024/0413032 A1     Dec. 12, 2024

Related U.S. Application Data

(60) Provisional application No. 63/506,457, filed on Jun. 6, 2023.

(51) Int. Cl.
| | |
|---|---|
| *H10W 74/10* | (2026.01) |
| *H10B 80/00* | (2023.01) |
| *H10W 42/20* | (2026.01) |
| *H10W 74/01* | (2026.01) |
| *H10W 90/00* | (2026.01) |

(52) U.S. Cl.
CPC .......... *H10W 74/121* (2026.01); *H10B 80/00* (2023.02); *H10W 42/20* (2026.01); *H10W 74/01* (2026.01); *H10W 90/00* (2026.01); *H10W 74/10* (2026.01); *H10W 90/752* (2026.01); *H10W 90/754* (2026.01)

(58) Field of Classification Search
CPC ............................................. H01L 2225/06562
See application file for complete search history.

(56) References Cited

U.S. PATENT DOCUMENTS

| | | | |
|---|---|---|---|
| 2023/0028943 A1* | 1/2023 | Noh | .................... H01L 23/3121 |
| 2023/0420386 A1* | 12/2023 | Chou | .................... H01L 24/48 |

* cited by examiner

*Primary Examiner* — Yu-Hsi D Sun
(74) *Attorney, Agent, or Firm* — DENTONS Durham Jones Pinegar

(57) ABSTRACT

A semiconductor package includes an insulation layer provided between a molding compound and an electromagnetic interface (EMI) layer. The insulation layer covers an exposed portion of a bond wire that extends beyond a top surface of the molding compound due to a Z-height reduction of the molding compound. The insulation layer prevents a short from occurring between the bond wire and the EMI layer.

20 Claims, 5 Drawing Sheets

400

COUPLE ELECTRONIC COMPONENTS TO SUBSTRATE — 410

COUPLE NON-ELECTRONIC COMPONENTS TO SUBSTRATE — 420

ATTACH BOND WIRE TO ONE OR MORE ELECTRONIC COMPONENTS — 430

COVER COMPONENTS AND BOND WIRE WITH MOLDING COMPOUND — 440

APPLY INSULATION LAYER — 450

FORM ELECTROMAGNETIC INTERFERENCE LAYER OVER MOLDING COMPOUND AND INSULATION LAYER — 460

INSULATION LAYER FOR A SEMICONDUCTOR PACKAGE

CROSS-REFERENCE TO RELATED APPLICATIONS

The present application claims priority to U.S. Provisional Application 63/506,457 entitled "INSULATION LAYER FOR A SEMICONDUCTOR PACKAGE", filed Jun. 6, 2023, the entire disclosure of which is hereby incorporated by reference in its entirety.

BACKGROUND

Some semiconductor packages, such NAND flash memory devices, typically include a stack of NAND memory dies. The stack of NAND memory dies are communicatively coupled to a substrate using a bond wire. The stack of memory dies and the bond wire, along with other electronic components (e.g., a flip chip die, a controller), are surrounded by a molding compound. An electromagnetic interference (EMI) layer may also encase the entire structure.

In order to prevent shorts from occurring between the bond wire and the EMI layer, the semiconductor package typically includes a wire clearance, or an amount of space, between a top portion of the bond wire and a bottom surface of the EMI layer. Due to manufacturing variations of the molding compound and/or the bond wire, the wire clearance between the bond wire and the EMI layer is typically set to a minimum distance.

As demand for semiconductor packages increase, there is also a demand to increase the capabilities of the semiconductor packages while maintaining or decreasing a Z-height of the semiconductor packages. However, increased capabilities often mean thicker/taller and/or more electronic components (e.g., thicker/taller NAND die stacks). Because a wire clearance is typically required, one way to maintain or reduce the Z-height of a semiconductor package is to reduce a thickness of a substrate of the semiconductor package. However, reducing the thickness of the substrate, while maintaining or increasing the capabilities of the semiconductor package, is complex and increases the cost of manufacturing semiconductor packages in terms of both time and money.

Accordingly, it would be beneficial to maintain or reduce a Z-height of a semiconductor package without substantially reducing a thickness of a substrate of the semiconductor package while also preventing shorts from occurring between a bond wire and an EMI layer of the semiconductor package.

SUMMARY

The present application describes a semiconductor package having an insulation layer provided between a surface (e.g., top surface) of a molding compound and an electromagnetic interface (EMI) layer. The insulation layer is used to cover an exposed portion of a bond wire that extends (or may extend) beyond the top surface of the molding compound. The insulation layer prevents a short from occurring between the bond wire and the EMI layer. Additionally, the insulation layer is used in lieu of a wire clearance. As such, a Z-height of the semiconductor package may be reduced. In another example, using the insulation layer in lieu of the wire clearance enables use of a thicker substrate while maintaining the desired Z-height of the semiconductor package.

Accordingly, the present application describes a semiconductor package that includes a substrate and a memory device communicatively coupled to the substrate using a bond wire. A molding compound covers the memory device and at least a first portion of the bond wire. A second portion of the bond wire extends past a top surface of the molding compound. An insulation layer is provided above the molding compound. The insulation layer covers the second portion of the bond wire that extends past the top surface of the molding compound. The semiconductor package also includes an EMI layer that at least partially surrounds the substrate, the molding compound and the insulation layer.

The present application also describes a method for fabricating a semiconductor package. In an example, the method includes coupling a NAND die stack and an associated bond wire to a surface of a substrate. The NAND die stack and a first portion of the bond wire are covered with a molding compound. An insulation layer is provided on a second portion of the bond wire that extends above a top surface of the molding compound. An electromagnetic interference (EMI) layer is provided over at least a portion of the substrate, the insulation layer and the molding compound.

A semiconductor package that includes a substrate and a memory device is also described. In an example, the memory device is communicatively coupled to the substrate by a communication means. A molding means covers the memory device and at least a first portion of the communication means. An insulation means is provided on a top surface of the molding means. The insulation means covers a second portion of the communication means that extends above the top surface of the molding means. An enclosure means at least partially surrounds the substrate, the molding means, and the insulation means.

This summary is provided to introduce a selection of concepts in a simplified form that are further described below in the Detailed Description. This summary is not intended to identify key features or essential features of the claimed subject matter, nor is it intended to be used to limit the scope of the claimed subject matter.

BRIEF DESCRIPTION OF THE DRAWINGS

Non-limiting and non-exhaustive examples are described with reference to the following Figures.

DETAILED DESCRIPTION

In the following detailed description, references are made to the accompanying drawings that form a part hereof, and in which are shown by way of illustrations specific embodiments or examples. These aspects may be combined, other aspects may be utilized, and structural changes may be made without departing from the present disclosure. Examples may be practiced as methods, systems or devices. The following detailed description is therefore not to be taken in a limiting sense, and the scope of the present disclosure is defined by the appended claims and their equivalents.

Demand for semiconductor packages (e.g., NAND memory devices) continues to increase. There are also demands to increase the capabilities of these semiconductor packages while maintaining or reducing a Z-height of the semiconductor packages. It is often difficult to reconcile these demands because increased capabilities often mean thicker/taller and/or more electronic components.

One way to maintain or reduce the Z-height of a semiconductor package is to reduce a thickness of a substrate of the semiconductor package. However, reducing the thickness of the substrate, while maintaining or increasing the capabilities of the semiconductor package, is complex and may increase the manufacturing costs of the semiconductor package.

In order to address the above, the present application describes an insulation layer for semiconductor packages. The insulation layer may be provided between a molding compound and an electromagnetic interface (EMI) layer of the semiconductor package. The insulation layer enables a thickness or a Z-height of the molding compound to be reduced while allowing a thickness of a substrate to be maintained or increased. The insulation layer covers an exposed portion of a bond wire (or a portion of the bond wire that is at risk for exposure) that extends (or may extend) beyond or above the molding compound. Thus, the insulation layer may prevent a short from occurring between the bond wire and the EMI layer.

In accordance with the above, many technical benefits may be realized including, but not limited to, reducing or maintaining a Z-height of a semiconductor package and/or maintaining or increasing a thickness of the substrate of the semiconductor package.

These and other examples will be explained in greater detail below with respect to FIG. 1-FIG. 4.

Figure 1:
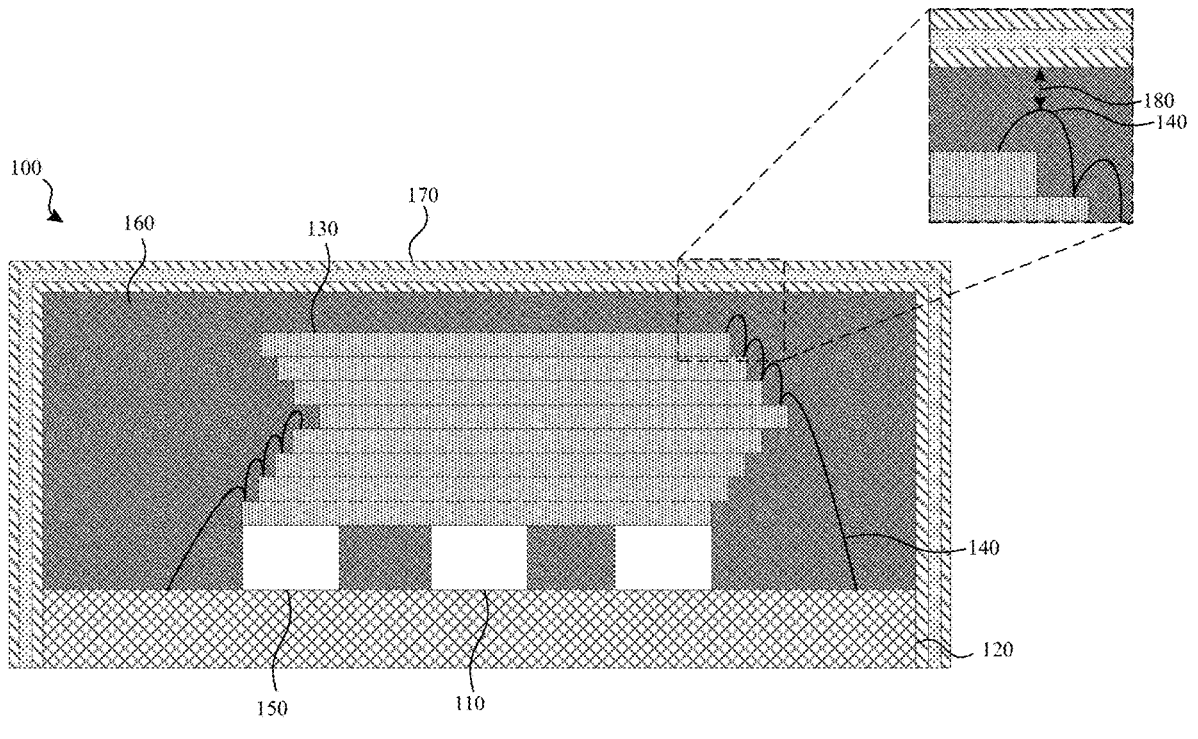
FIG. 1 illustrates an example of an existing semiconductor package.

FIG. 1 illustrates an example of an existing semiconductor package 100. In the example shown, the semiconductor package 100 includes an integrated circuit 110. The integrated circuit 110 may be a flip chip die, a controller, or other integrated circuit. The integrated circuit 110 is mounted on a top surface of a substrate 120 of the semiconductor package 100.

The semiconductor package 100 may also include a NAND die stack 130. The NAND die stack 130 includes two or more NAND dies that are electrically and/or communicatively coupled together. The NAND die stack 130 is also electrically and/or communicatively coupled to the substrate 120 using a bond wire 140.

The semiconductor package 100 also includes one or more spacers 150. Each of the one or more spacers 150 may be provided on the top surface of the substrate 120. In the example shown, two spacers 150 are provided underneath the NAND die stack 130 while one of the spacers 150 is provided on a first side of the integrated circuit 110 and another spacer 150 is provided on a second side of the integrated circuit 110.

The semiconductor package 100 also includes a molding compound 160. The molding compound 160 covers the integrated circuit 110, the one or more spacers 150, the NAND die stack 130 and the bond wire 140.

The semiconductor package 100 also includes an electromagnetic interference (EMI) layer 170. The EMI layer 170 is used to protect the semiconductor package 100 from electromagnetic interferences. The EMI layer 170 includes three different layers—a first stainless steel layer, a copper layer, and a second stainless steel layer.

In the example shown, a portion of the bond wire 140 extends above a top surface of the NAND die stack 130. To help ensure that a short does not occur between the bond wire 140 and the EMI layer 170, a wire clearance 180 is used or defined.

The wire clearance 180 is an amount of space that is provided between the portion of the bond wire 140 that extends above the top surface of the NAND die stack 130 and a bottom surface of the EMI layer 130. The amount of space defined by the wire clearance 180 is typically filled with the molding compound 160.

Due to manufacturing variations or tolerances of the molding compound 160 and/or the bond wire 140, the wire clearance 180 is typically set to a minimum distance. In an example, the minimum distance is fifty micrometers (μm) (or more).

In most electronic devices, Z-height space is precious. As such, it is desirable to minimize or reduce the Z-height of electronic components (such as the semiconductor device 100) that are provided in these electronic devices. However, it is also desirable to increase the performance capabilities of these electronic components.

In an example, and in order to increase the performance capabilities of the semiconductor device 100, a size of the NAND die stack 130 may be increased. For example, a thickness of each NAND die of the NAND die stack 130 may increase. In another example, additional NAND dies may be added to the NAND die stack 130.

In order to maintain or reduce a Z-height (or thickness) of the semiconductor package 100, one solution is to reduce a thickness of the substrate 120. However, reducing the thickness of the substrate 120 is complex—especially while maintaining or increasing the capabilities of the semiconductor package 100.

Figure 2:
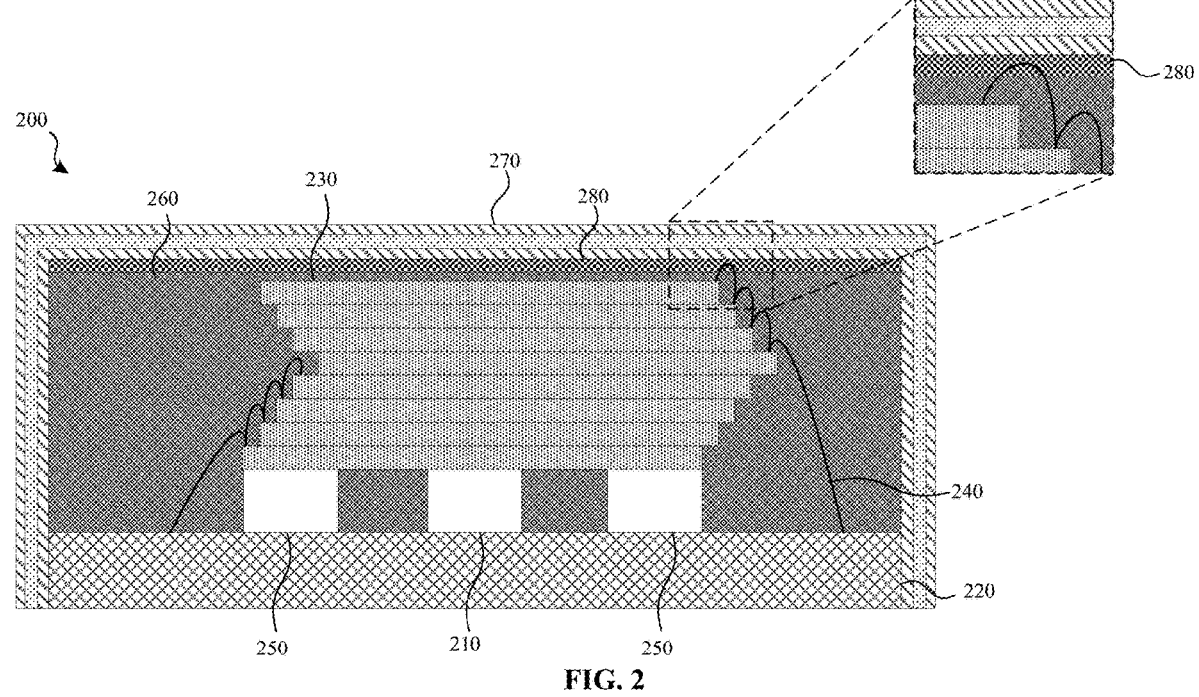
FIG. 2 illustrates a semiconductor package having an insulation layer provided between a top surface of a molding compound and an electromagnetic interference (EMI) layer according to an example.

FIG. 2 illustrates a semiconductor package 200 having an insulation layer 280 provided between a top surface of a molding compound 260 and an electromagnetic interference (EMI) layer 270 according to an example. In an example, the semiconductor package 200 may include similar electronic components as the semiconductor package 100 shown and described with respect to FIG. 1.

For example, the semiconductor package 200 includes an integrated circuit 210. The integrated circuit 210 may be a flip chip die, a controller, or another integrated circuit. The integrated circuit 210 is mounted on a top surface of a substrate 220 of the semiconductor package 200. The integrated circuit 210 may be mounted to the top surface of the substrate 220 using any suitable surface mounting process.

The semiconductor package 200 also includes a NAND die stack 230. In an example, the NAND die stack 230 includes two or more NAND dies that are electrically and/or communicatively coupled together. The NAND die stack 230 is also electrically and/or communicatively coupled to the substrate 220 using a bond wire 240. Although a NAND die stack 230 is specifically mentioned, the semiconductor package 200 may include any type of volatile or non-volatile memory device.

The semiconductor package 200 may also include one or more spacers 250. Each of the one or more spacers 250 may be provided on the top surface of the substrate 220 and/or underneath the NAND die stack 230. The one or more spacers 250 may also be positioned on or near the integrated circuit 210. For example, a first spacer 250 is provided on a first side of the integrated circuit 210 and a second spacer 250 is provided on a second side of the integrated circuit 210. Although a specific arrangement is shown, a spacer 250 may be provided on the integrated circuit 210 and/or be included as part of the NAND die stack 230.

A molding compound 260 encapsulates or covers the integrated circuit 210, the one or more spacers 250, the NAND die stack 230 and at least a portion of the bond wire 240. The molding compound 260 may be suitable molding compound 260 that covers, protects and/or dissipates heat from the various electronic components of the semiconductor package 200.

In this example, a height (e.g., a Z-height) or a thickness of the molding compound 260 has been reduced when compared with the height or the thickness of the molding compound 160 shown and described with respect to FIG. 1. For example, in order to save Z-height space, the height of the molding compound 260 has been reduced by the determined minimum wire clearance amount (e.g., the wire clearance amount 180 (FIG. 1)).

In the example that was shown and described with respect to FIG. 1, the minimum wire clearance amount was fifty μ. As such, in the example shown in FIG. 2, the height of the molding compound 260 is reduced by fifty μm (or more).

In order to reduce or negate the possibility of a short occurring between the bond wire 240 and an EMI layer 270 of the semiconductor package 200, an insulation layer 280 is provided between the top surface of the molding compound 260 and a bottom surface of the EMI layer 270. In an example, the insulation layer 280 covers a portion of the bond wire 240 (if any) that is exposed (or is at risk from being exposed) due to a height of the molding compound 260 being reduced by the minimum wire clearance amount (e.g., fifty μm).

The insulation layer 280 may be made from one or more insulation materials. These materials may include, but are not limited to, polyimide, parylene, silicon dioxide, polymers or any combination thereof. In an example, the insulation material may be in ink form that is printed on, or is otherwise applied, to the top surface of the molding compound 260. When an ink is used, the ink may be comprised of organic polymers. The ink may also have high temperature resistance and electrical insulation properties. In another example, the insulation material may be provided on the top surface of the molding compound 260 using various processes including, but not limited to, a spraying process, a sputtering process, a printing process, Physical Vapor Deposition (PVD) and/or Chemical Vapor Deposition (CVD).

In an example, the insulation layer 280 is approximately five μm thick. As such, approximately forty-five μm (or more) of space may be saved in the Z-dimension when the insulation layer 280 is used in lieu of a minimum wire clearance. The savings in space may be used to reduce the overall height of the semiconductor package 200. In another example, a thickness of the substrate 200 may be increased by amount of space that was saved by using the insulation layer 280 instead of the wire clearance. Increasing the thickness of the substrate 200 may reduce the complexity of manufacturing the semiconductor package 200 which may save time and/or money.

As previously indicated, the semiconductor package 200 also includes an EMI layer 270. The EMI layer 170 may be a multi-metal layer that includes metals and/or materials that redirect and/or absorb electromagnetic radiation that could negatively affect the NAND die stack 230 or other electronic components of the semiconductor package 200. In an example, the EMI layer 270 includes three different layers—a first stainless steel layer, a copper layer, and a second stainless steel layer. Although specific materials are described, the EMI layer 270 may be formed from any suitable materials.

Figure 3A:
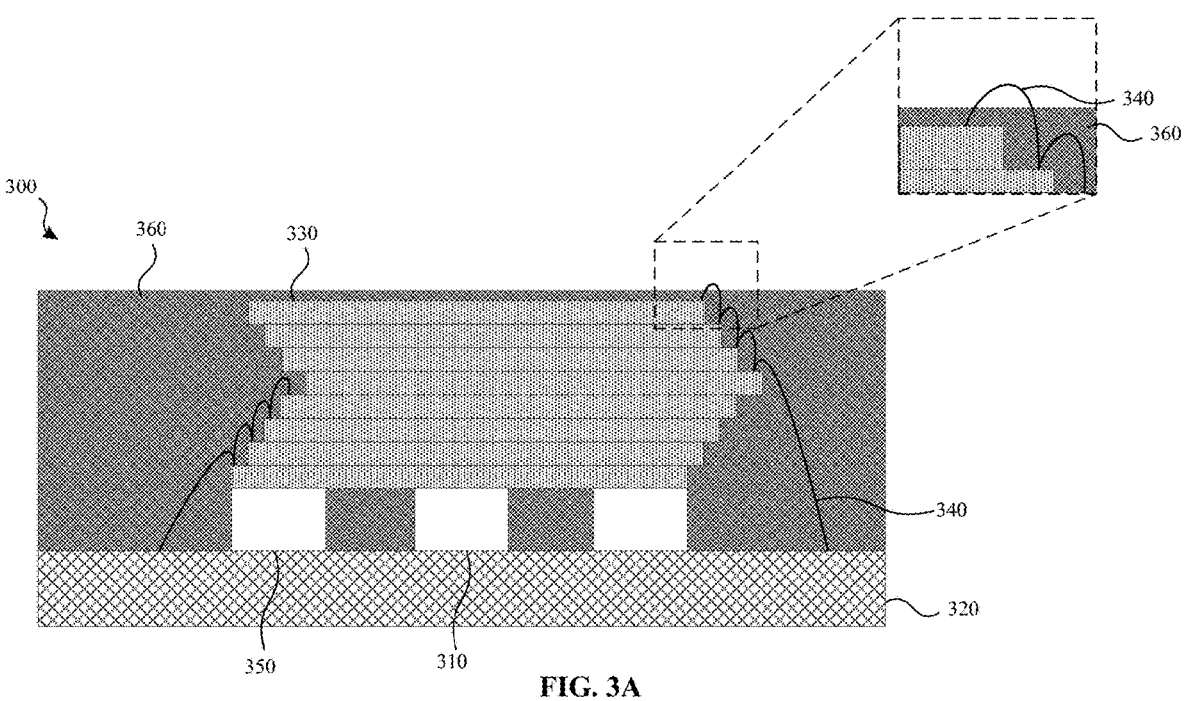
FIG. 3A illustrates a semiconductor package in which a bond wire extends above a top surface of a molding compound according to an example.
Figure 3B:
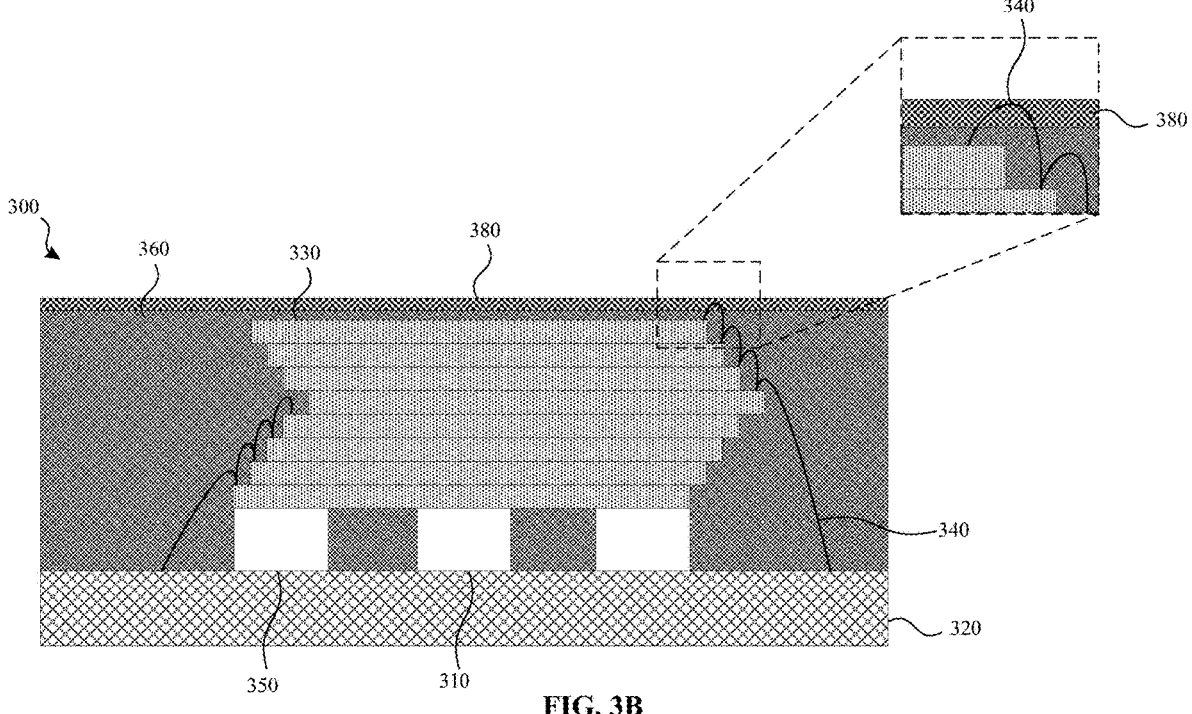
FIG. 3B illustrates an insulation layer provided across an entire top surface of the molding compound of the semiconductor package shown and described with respect to FIG. 3A according to an example.

FIG. 3A illustrates a semiconductor package 300 in which a bond wire 340 extends above a top surface of a molding compound 360 according to an example. In an example, the semiconductor package 300 may be similar to the semiconductor package 200 shown and described with respect to FIG. 2. Additionally, FIG. 3A, in addition to FIG. 3B-FIG. 3D, may be used to illustrate how the semiconductor package 300 is manufactured to include an insulation layer 380 (FIG. 3B).

In an example, the semiconductor package 300 includes a substrate 320 and an integrated circuit 310. The integrated circuit 310 is mounted on a top surface of the substrate 320 using any suitable surface mounting technique. One or more spacers 350 may also be mounted to the surface of the substrate 320. In an example the one or more spacers 350 and the integrated circuit 310 may be mounted to the substrate 320 in any order.

The semiconductor package 300 also includes a NAND die stack 330. Although a NAND die stack 330 is specifically mentioned, the semiconductor package 300 may include any volatile or non-volatile memory device. In the example shown, the NAND die stack 330 include eight NAND dies. Although eight NAND dies are shown, the NAND die stack 330 may include any number of NAND dies.

In an example, the NAND die stack 330 is mounted to a top surface of each spacer 350 and to a top surface of the integrated circuit 310. Although this specific configuration is shown, the NAND die stack 330 may be mounted to the top surface of the substrate 320. In another example, a portion of the NAND die stack 330 may be mounted to the top surface of the substrate 320 and another portion of the NAND die stack 330 may be coupled to one or more of the spacers 350 and/or to the integrated circuit 310.

The semiconductor package 300 also includes a bond wire 340. The bond wire 340 electrically and/or communicatively couples the NAND die stack 330 to the substrate 320.

When the spacers 350, the integrated circuit 310, the NAND die stack 330 and/or the bond wire 340 have been coupled to the substrate 320, a molding compound 360 is applied to the structure. The molding compound 360 encapsulates or covers the integrated circuit 310, the one or more spacers 350, the NAND die stack 330 and at least a portion of the bond wire 340. As previously indicated, the molding compound 260 may be any suitable molding compound 360 that covers, protects and/or dissipates heat from the various electronic components of the semiconductor package 300.

As shown in FIG. 3A, at least a top portion (or a first portion) of the bond wire 340 may extend above a top surface of the molding compound 360. In an example, the top portion of the bond wire 340 is exposed or otherwise extends above the top surface of the molding compound 360 due to one or more of: a manufacturing tolerance of the molding compound 360; a manufacturing tolerance of the bond wire 340; placement or coupling tolerances associated with the bond wire 340 when the bond wire 340 is electrically and/or communicatively coupled to the NAND die stack 330; or a reduction in the amount of molding compound 360 that is applied to the semiconductor package 300 (e.g., a thickness of the molding compound 360 is reduced by determined minimum wire clearance).

FIG. 3B illustrates an insulation layer 380 provided across an entire top surface of the molding compound 360 of the semiconductor package 300 shown and described with respect to FIG. 3A according to an example. In an example, the insulation layer 380 covers the exposed portion of the bond wire 340. The insulation layer 380 may be made from one or more insulation materials including, but are not limited to, polyimide, parylene, silicon dioxide, polymers or any combination thereof.

In an example, the insulation material may be in the form of an ink that is printed on or is otherwise applied to the top surface of the molding compound 360. In another example, the insulation material may be provided on the top surface of the molding compound 360 using a spraying process or a sputtering process. As previously described, in order to save a maximum amount of Z-height, the insulation layer 380 is approximately five μm thick. As such, approximately forty-five μm (or more) of space may be saved in the Z-dimension such as previously described.

Figure 3C:
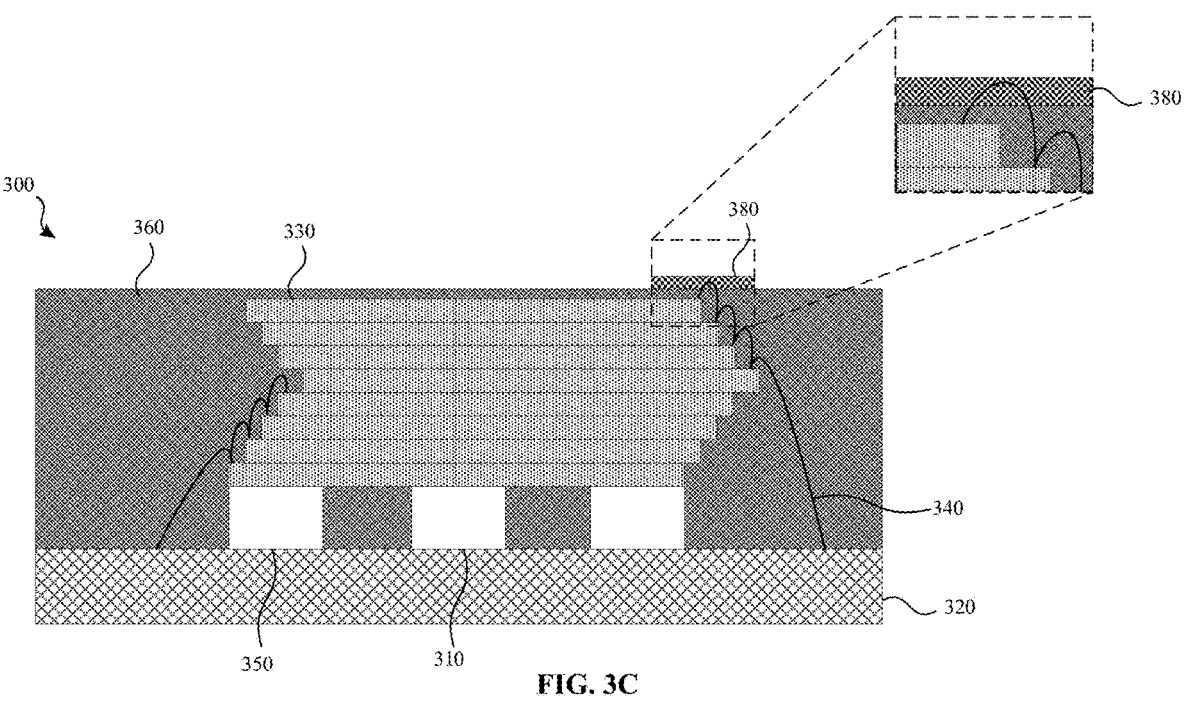
FIG. 3C illustrates an insulation layer provided across a portion of the top surface of the molding compound of the semiconductor package shown and described with respect to FIG. 3A according to an example.

Although FIG. 3B illustrates the insulation layer 380 being applied to the entire top surface of the molding compound 360, the insulation layer 380 may be applied to a portion of the top layer of the molding compound 360 such as shown in FIG. 3C. In this example, the insulation layer 380 is only applied to a portion of the top surface of the molding compound 360 at which the bond wire 340 is (or is at risk of being) exposed.

Figure 3D:
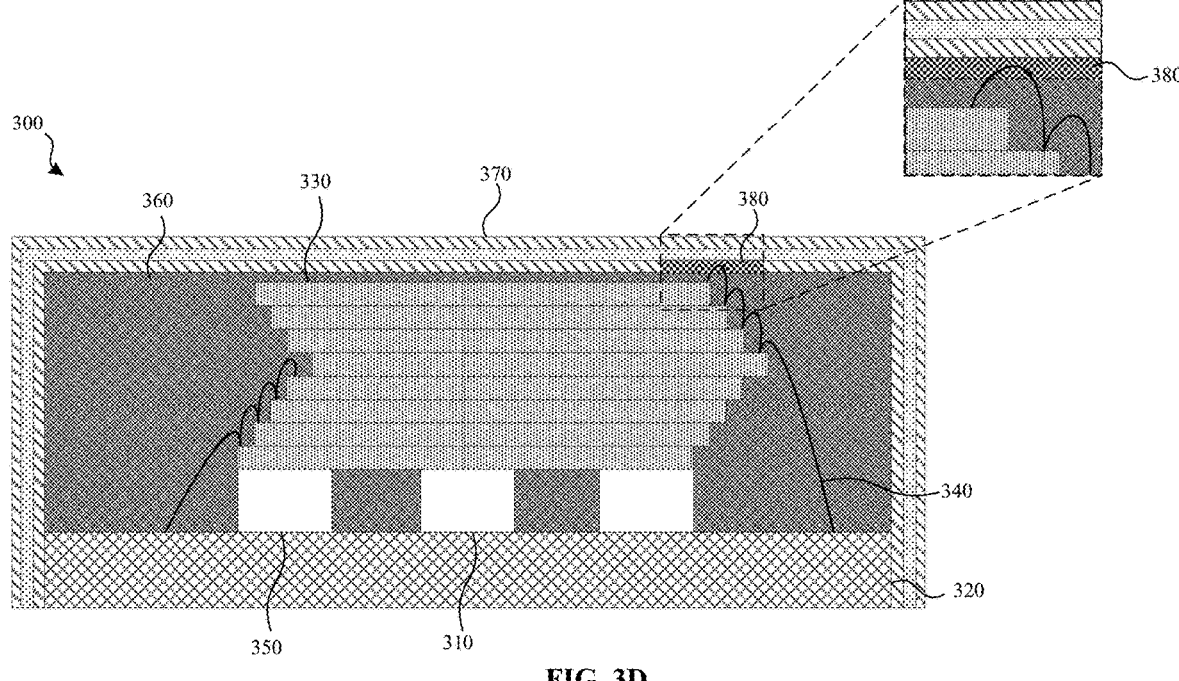
FIG. 3D illustrates the semiconductor package of FIG. 3C in which an electromagnetic interference (EMI) layer has been added according to an example.

FIG. 3D illustrates the semiconductor package of FIG. 3C in which an electromagnetic interference (EMI) layer 370 has been added according to an example. The EMI layer 370 may be formed on a top surface of the insulation layer 380 and/or the molding compound 360. Additionally, the EMI layer 370 may at least partially surround or encase the substrate 320, the integrated circuit 310, the one or more spacers 350, the NAND die stack 330, the bond wire 340, the insulation layer 380 and/or the molding compound 360. In an example, the EMI layer 370 is a multi-metal layer and may include one or more layers of stainless steel, copper or other materials.

In the examples described with respect to FIG. 3A-FIG. 3D, the insulation layer 380 is shown and described as being applied to the top surface of the molding compound 360. However, in other examples, the insulation layer 380 may be provided on or integrated with the EMI layer 370.

Figure 4:
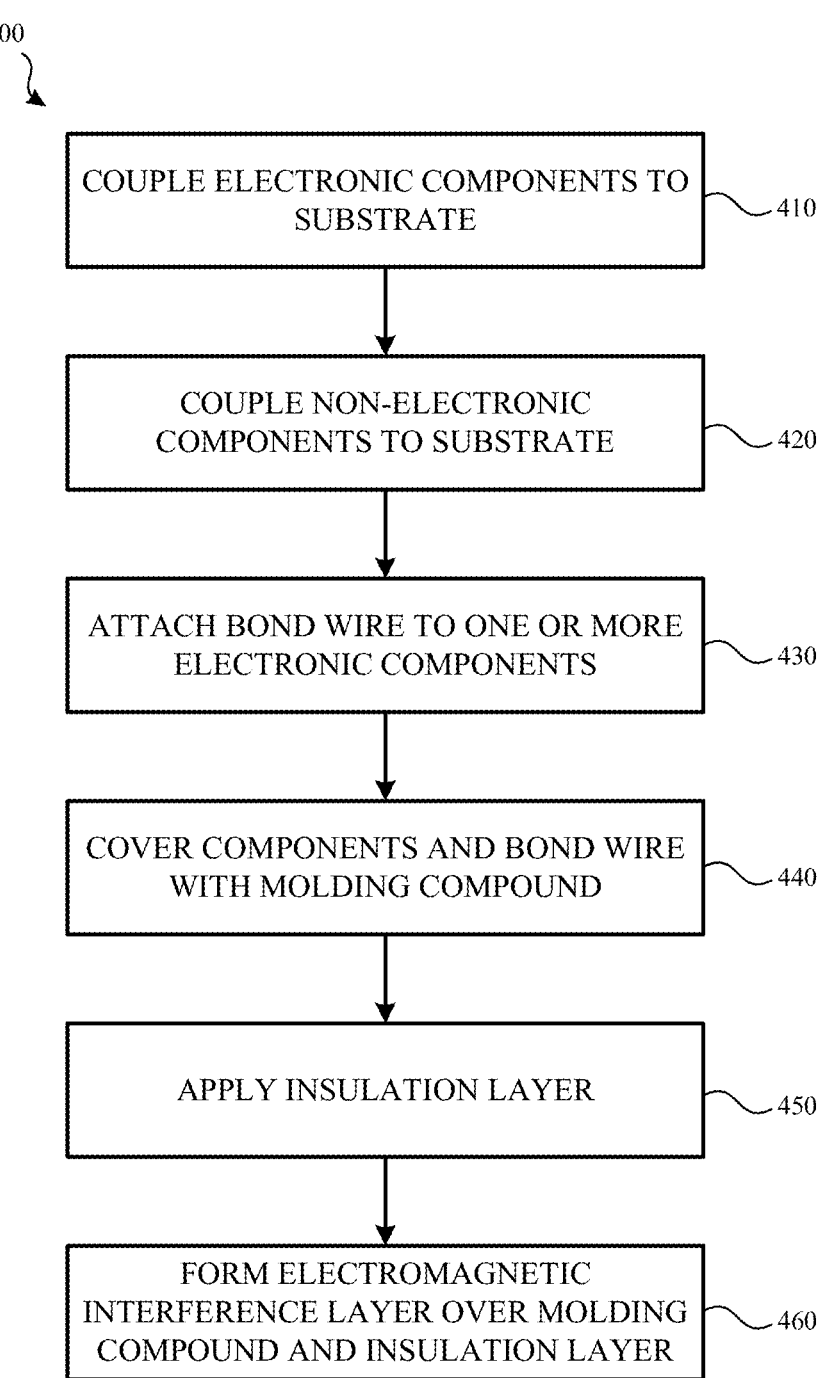
FIG. 4 illustrates a method for manufacturing a semiconductor package according to an example.

FIG. 4 illustrates a method 400 for manufacturing a semiconductor package according to an example. In an example, the method 400 may be used to manufacture the semiconductor package 200 shown and described with respect to FIG. 2 and/or the semiconductor package 300 shown and described with respect to FIG. 3D.

In an example, the method 400 begins when one or more electronic components are coupled (410) to a substrate. In an example, the one or more electronic components may include, but are not limited to, an integrated circuit and a memory device. The integrated circuit may be a flip chip die, a controller, or another integrated circuit. The memory device may be any volatile or non-volatile memory device. In an example, the memory device is a NAND die stack. The electronic components may be surface mounted to the substrate using any suitable surface mounting process.

One or more non-electronic components may also be mounted (420) to the substrate. In an example, the one or more non-electronic components may be one or more spacers. In an example, the one or more non-electronic components may be mounted to the substrate before, during or after the electronic components are mounted to the substrate.

A bond wire is attached (430) to one or more of the electronic components. In an example, the bond wire is attached to the memory device. The bond wire may be used to electrically and/or communicatively couple the memory device to the substrate.

A molding compound 440 is used to cover 440 the electronic components, the non-electronic components and at least a portion of the bond wire. The molding compound may be any suitable molding compound that covers, protects and/or dissipates heat from the various electronic components of the semiconductor package. In an example, and due to manufacturing tolerances of the molding compound and/or the bond wire, at least a portion of the bond wire may extend beyond or above a top surface of the molding compound. In another example, the molding compound may completely cover the bond wire.

An insulation layer is then applied (450). In an example, the insulation layer is applied across an entire top surface of the molding compound. In another example, the insulation layer is applied to a portion of the top surface of the molding compound. For example, the insulation layer may only be applied to areas in which the bond wire is exposed (or is at risk of being exposed) or is otherwise not covered by the molding compound.

When the insulation layer has been applied, an electromagnetic interference (EMI) layer is formed (460) around/over the molding compound, the insulation layer and at least a portion of the substrate.

Although the examples described herein are shown and described with respect to a semiconductor package having an integrated circuit and a NAND die stack or other non-volatile memory stack, the features described herein may be applied to any type of semiconductor product.

Accordingly, examples of the present disclosure describe a semiconductor package, comprising: a substrate; a molding compound covering a memory device communicatively coupled to the substrate by a bond wire, at least a portion of the bond wire extending past a top surface of the molding compound; an insulation layer provided above the molding compound and covering the at least the portion of the bond wire that extends past the top surface of the molding compound; and an electromagnetic interference (EMI) layer at least partially surrounding the substrate, the molding compound, and the insulation layer. In an example, the insulation layer is approximately five micrometers (μm) thick. In an example, the insulation layer is provided on a portion of a top surface of the molding compound. In an example, the insulation layer is provided on an entire top surface of the molding compound. In an example, the insulation layer is comprised of ink. In an example, the insulation layer prevents a short from occurring between the EMI layer and the at least the portion of the bond wire that extends past the top surface of the molding compound. In an example, the insulation layer enables a Z-height of the molding compounding to be reduced by approximately forty-five micrometers (μm) or more. In an example, the memory device is a NAND die stack.

The present application also describes a method for fabricating a semiconductor package, comprising: coupling a NAND die stack and an associated bond wire to a surface of a substrate; covering the NAND die stack and a first portion of the bond wire with a molding compound; providing an insulation layer on a second portion of the bond wire, the second portion of the bond wire extending above a top surface of the molding compound; and forming an electromagnetic interference (EMI) layer around at least a portion of the substrate, the insulation layer and the molding compound. In an example, the insulation layer is provided on the second portion of the bond wire using a one or more of a spraying process, a printing process and a sputtering process. In an example, the insulation layer is approximately five micrometers (μm) thick. In an example, the insulation layer is provided on an entire top surface of the molding compound. In an example, the insulation layer is comprised of ink. In an example, the insulation layer prevents a short from occurring between the EMI layer and the second portion of the bond wire. In an example, providing the insulation layer on the second portion of the bond wire comprises forming the insulation layer when the EMI layer is formed.

In another example, a semiconductor package is described. In an example, the semiconductor package comprises: a substrate; a memory device communicatively coupled to the substrate by a communication means; a molding means covering the memory device and at least a first portion of the communication means; an insulation means covering a second portion of the communication means that extends above the top surface of the molding means; and an enclosure means at least partially surrounding the substrate, the molding means, and the insulation means. In an example, the memory device is a NAND die stack. In an example, the insulation means is approximately five micrometers (μm) thick. In an example, the insulation means prevents a short from occurring between the enclosure means and the second portion of the communication means. In an example, the insulation means is provided on an entire top surface of the molding means.

The description and illustration of one or more aspects provided in the present disclosure are not intended to limit or restrict the scope of the disclosure in any way. The aspects, examples, and details provided in this disclosure are considered sufficient to convey possession and enable others to make and use the best mode of claimed disclosure.

The claimed disclosure should not be construed as being limited to any aspect, example, or detail provided in this disclosure. Regardless of whether shown and described in combination or separately, the various features (both structural and methodological) are intended to be selectively rearranged, included or omitted to produce an embodiment with a particular set of features. Having been provided with the description and illustration of the present application, one skilled in the art may envision variations, modifications, and alternate aspects falling within the spirit of the broader aspects of the general inventive concept embodied in this application that do not depart from the broader scope of the claimed disclosure.

References to an element herein using a designation such as "first," "second," and so forth does not generally limit the quantity or order of those elements. Rather, these designations may be used as a method of distinguishing between two or more elements or instances of an element. Thus, reference to first and second elements does not mean that only two elements may be used or that the first element precedes the second element. Additionally, unless otherwise stated, a set of elements may include one or more elements.

Terminology in the form of "at least one of A, B, or C" or "A, B, C, or any combination thereof" used in the description or the claims means "A or B or C or any combination of these elements." For example, this terminology may include A, or B, or C, or A and B, or A and C, or A and B and C, or 2A, or 2B, or 2C, or 2A and B, and so on. As an additional example, "at least one of: A, B, or C" is intended to cover A, B, C, A-B, A-C, B-C, and A-B-C, as well as multiples of the same members. Likewise, "at least one of: A, B, and C" is intended to cover A, B, C, A-B, A-C, B-C, and A-B-C, as well as multiples of the same members.

Similarly, as used herein, a phrase referring to a list of items linked with "and/or" refers to any combination of the items. As an example, "A and/or B" is intended to cover A alone, B alone, or A and B together. As another example, "A, B and/or C" is intended to cover A alone, B alone, C alone, A and B together, A and C together, B and C together, or A, B, and C together.

What is claimed is:

1. A semiconductor package, comprising:
    a substrate;
    a molding compound covering a memory device communicatively coupled to the substrate by a bond wire, at least a portion of the bond wire extending past a top surface of the molding compound;
    an insulation layer provided above the molding compound and covering the at least the portion of the bond wire that extends past the top surface of the molding compound; and
    an electromagnetic interference (EMI) layer at least partially surrounding the substrate, the molding compound, and the insulation layer.

2. The semiconductor package of claim 1, wherein the insulation layer is approximately five micrometers (μm) thick.

3. The semiconductor package of claim 1, wherein the insulation layer is provided on an entire top surface of the molding compound.

4. The semiconductor package of claim 1, wherein the insulation layer is comprised of ink.

5. The semiconductor package of claim 1, wherein the insulation layer prevents a short from occurring between the EMI layer and the at least the portion of the bond wire that extends past the top surface of the molding compound.

6. The semiconductor package of claim 1, wherein the insulation layer enables a Z-height of the molding compound to be reduced by approximately forty-five micrometers (μm) or more.

7. The semiconductor package of claim 1, wherein the memory device is a NAND die stack.

8. The semiconductor package of claim 1, wherein the insulation layer comprises at least one of polyimide, parylene, silicon dioxide, and a polymer.

9. A method for fabricating a semiconductor package, comprising:
    coupling a NAND die stack and an associated bond wire to a surface of a substrate;
    covering the NAND die stack and a first portion of the bond wire with a molding compound;
    providing an insulation layer on a second portion of the bond wire, the second portion of the bond wire extending above a top surface of the molding compound; and
    forming an electromagnetic interference (EMI) layer around at least a portion of the substrate, the insulation layer and the molding compound.

10. The method of claim 9, wherein the insulation layer is provided on the second portion of the bond wire using a one or more of a spraying process, a printing process and a sputtering process.

11. The method of claim 9, wherein the insulation layer is approximately five micrometers (μm) thick.

12. The method of claim 9, wherein the insulation layer is provided on an entire top surface of the molding compound.

13. The method of claim 9, wherein the insulation layer is comprised of ink.

14. The method of claim 9, wherein the insulation layer prevents a short from occurring between the EMI layer and the second portion of the bond wire.

15. The method of claim 9, wherein providing the insulation layer on the second portion of the bond wire comprises forming the insulation layer when the EMI layer is formed.

16. A semiconductor package, comprising:

a substrate;

a memory device communicatively coupled to the substrate by a communication means;

a molding means covering the memory device and at least a first portion of the communication means;

an insulation means covering a second portion of the communication means that extends above a top surface of the molding means; and an enclosure means at least partially surrounding the substrate, the molding means, and the insulation means.

17. The semiconductor package of claim 16, wherein the memory device is a NAND die stack.

18. The semiconductor package of claim 16, wherein the insulation means is approximately five micrometers (μm) thick.

19. The semiconductor package of claim 16, wherein the insulation means prevents a short from occurring between the enclosure means and the second portion of the communication means.

20. The semiconductor package of claim 16, wherein the insulation means is provided on an entire top surface of the molding means.

* * * * *